United States Patent
Fan

(10) Patent No.: US 10,014,187 B2
(45) Date of Patent: Jul. 3, 2018

(54) CAVITY PACKAGE WITH PRE-MOLDED SUBSTRATE

(71) Applicant: Ubotic Company Limited, Tsuen Wan (HK)

(72) Inventor: Chun Ho Fan, Tsuen Wan (HK)

(73) Assignee: UBOTIC COMPANY LIMITED, Tsuen Wan, Hong Kong (CN)

(*) Notice: Subject to any disclaimer, the term of this patent is extended or adjusted under 35 U.S.C. 154(b) by 0 days.

(21) Appl. No.: 15/493,167

(22) Filed: Apr. 21, 2017

(65) Prior Publication Data

US 2017/0221726 A1 Aug. 3, 2017

Related U.S. Application Data

(62) Division of application No. 14/469,811, filed on Aug. 27, 2014, now Pat. No. 9,659,855.

(60) Provisional application No. 61/870,352, filed on Aug. 27, 2013.

(51) Int. Cl.
| | |
|---|---|
| *H01L 21/48* | (2006.01) |
| *H01L 21/52* | (2006.01) |
| *H01L 23/495* | (2006.01) |
| *H01L 23/04* | (2006.01) |

(52) U.S. Cl.
CPC ...... *H01L 21/4828* (2013.01); *H01L 21/4817* (2013.01); *H01L 21/4825* (2013.01); *H01L 21/52* (2013.01); *H01L 23/04* (2013.01); *H01L 23/4952* (2013.01); *H01L 23/49541* (2013.01)

(58) Field of Classification Search
None
See application file for complete search history.

(56) References Cited

U.S. PATENT DOCUMENTS

| | | | |
|---|---|---|---|
| 9,659,855 B2* | 5/2017 | Fan | H01L 21/4817 |
| 2006/0060953 A1 | 3/2006 | Yang et al. | |
| 2008/0111217 A1 | 5/2008 | Dimaano et al. | |
| 2009/0166842 A1 | 7/2009 | Lee | |
| 2009/0289335 A1 | 11/2009 | Camacho et al. | |
| 2013/0093031 A1 | 4/2013 | Gao et al. | |

OTHER PUBLICATIONS

Fan, "Cavity Package with Pre-Molded Substrate", U.S. Appl. No. 14/469,811, filed Aug. 27, 2014.

* cited by examiner

*Primary Examiner* — Robert Carpenter
(74) *Attorney, Agent, or Firm* — Keating and Bennett, LLP

(57) ABSTRACT

A cavity package is set forth along with a method of manufacturing thereof. The method comprises applying a selective plating resist to a metallic substrate in a pattern to expose portions for a ring, tie bars, die attach pad and input/output wire bonding pads; elective depositing of metal plating using the selective plating resist; removing the selective metal plating resist; applying a selective etching resist to the substrate; selectively etching portions of the substrate not covered by the selective etching resist; stripping away the selective etching resist; pre-molding a leadframe to the substrate so as to surround the die attach pad portion; etching the tie bars away from the bottom surface of the substrate; attaching a semiconductor device die to the die attach pad; wire bonding the semiconductor device to the input/output wire bonding pads; and attaching a cap to the ring portion of the substrate and the die attach pad to protect the wire bonded semiconductor device die and permit electrical grounding.

6 Claims, 13 Drawing Sheets

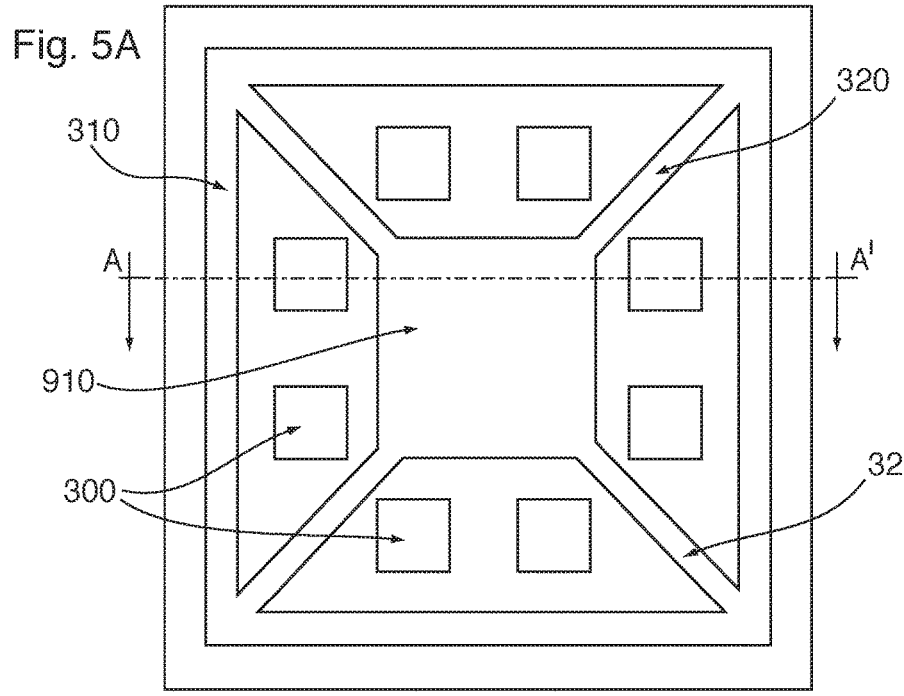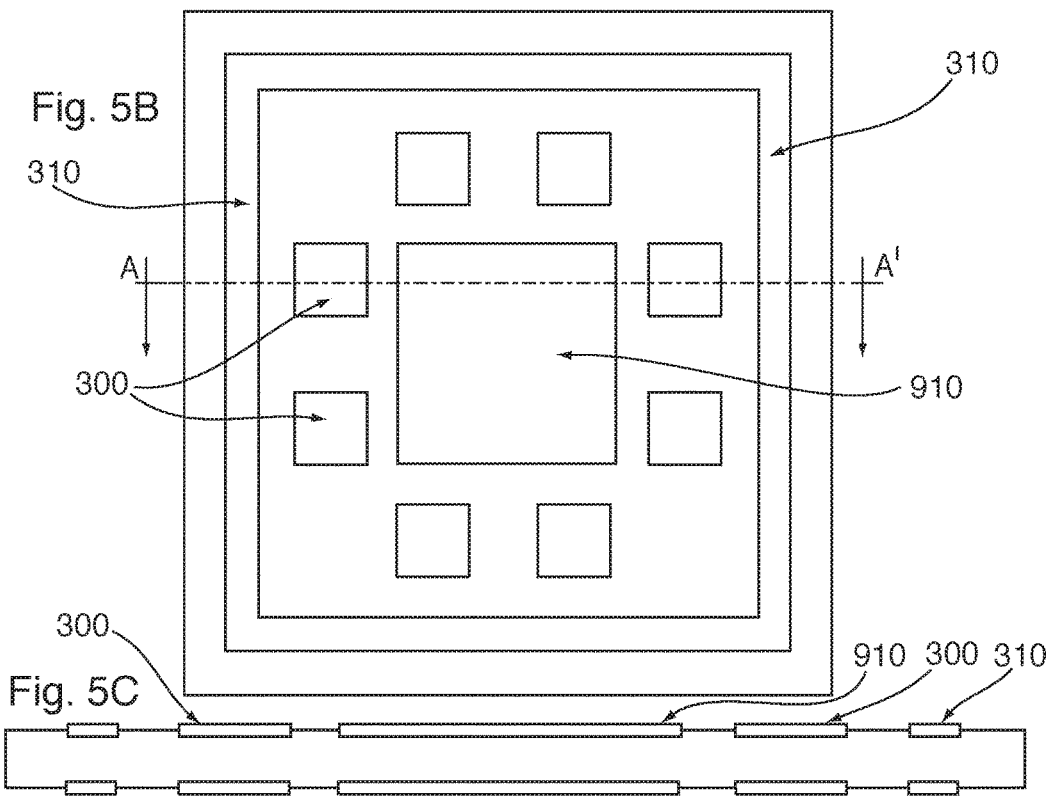

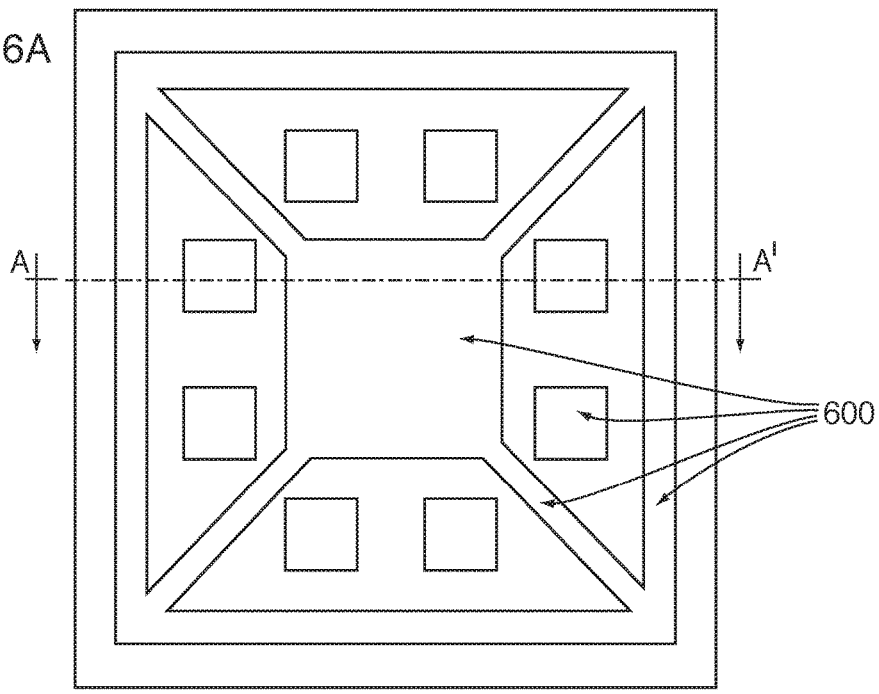
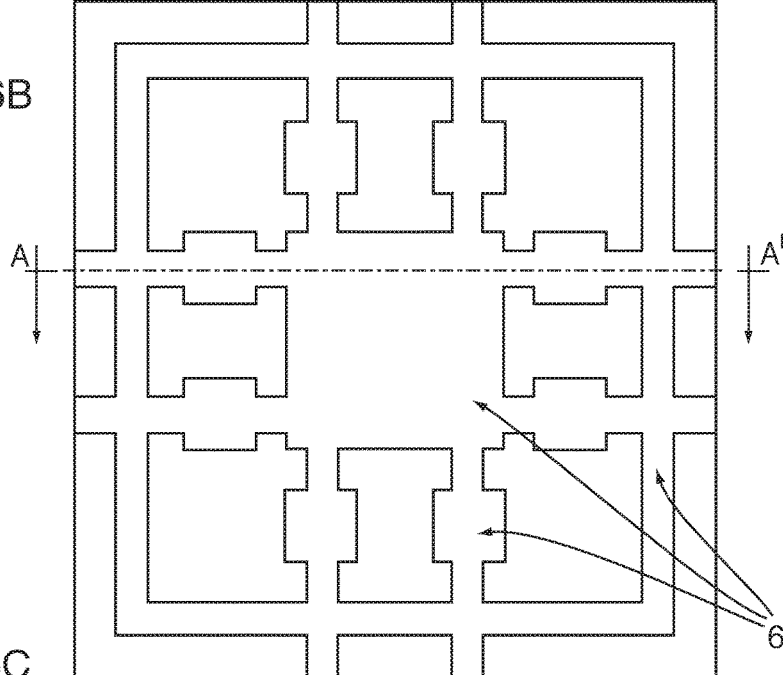
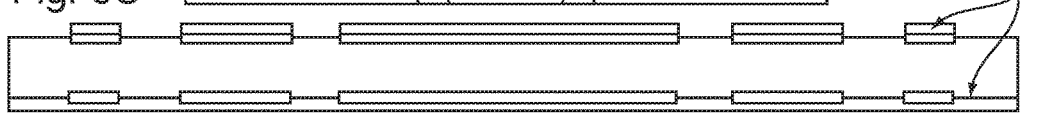

1000

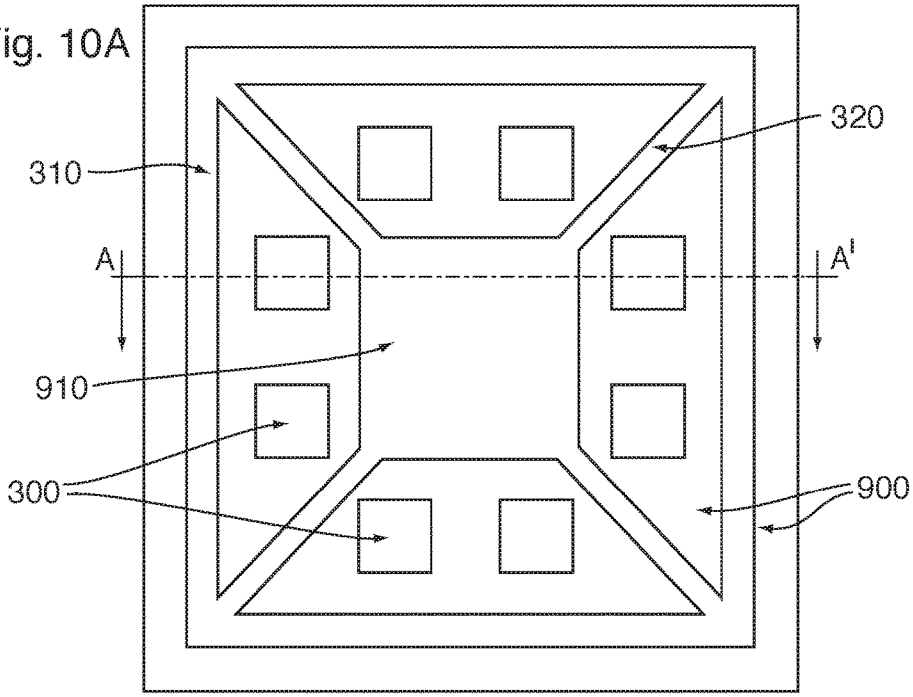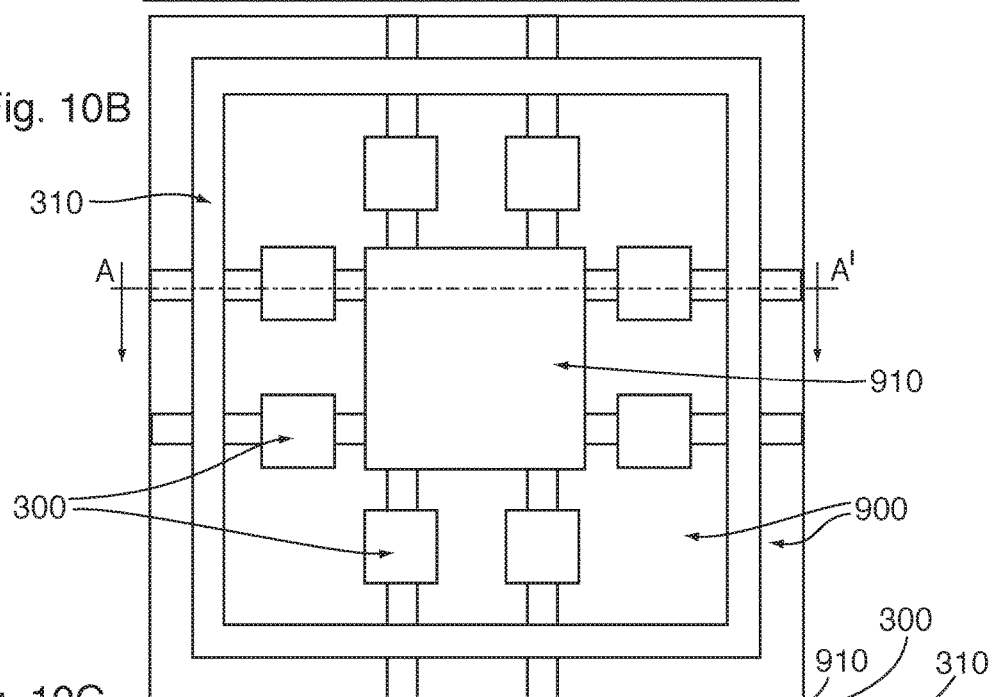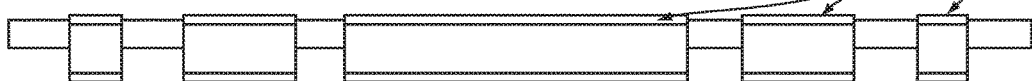

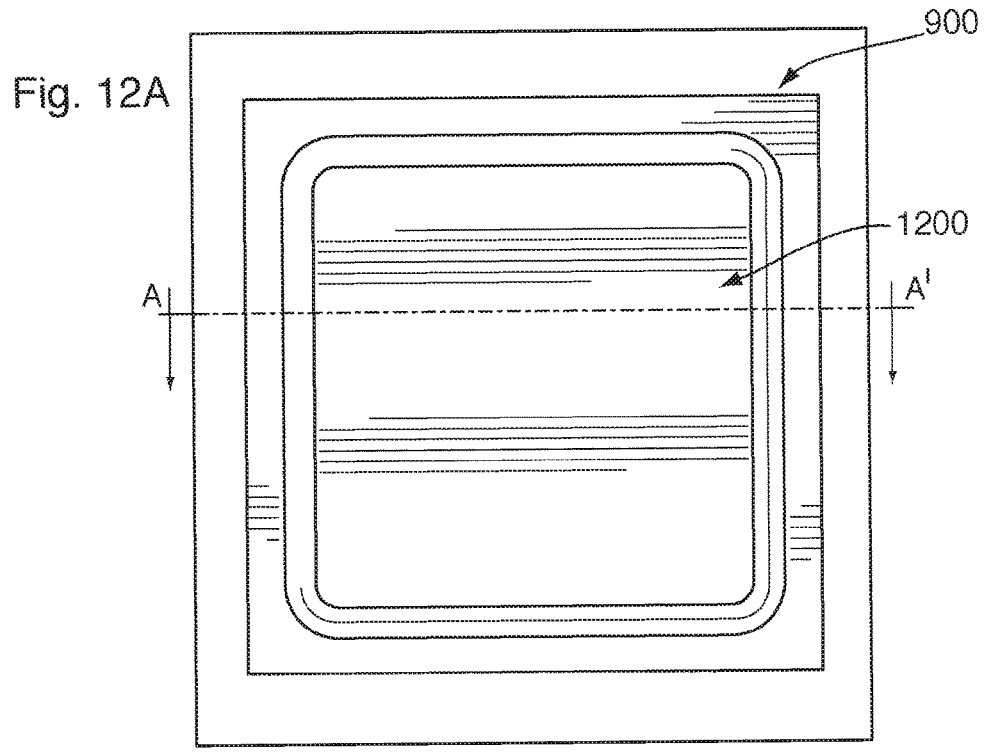
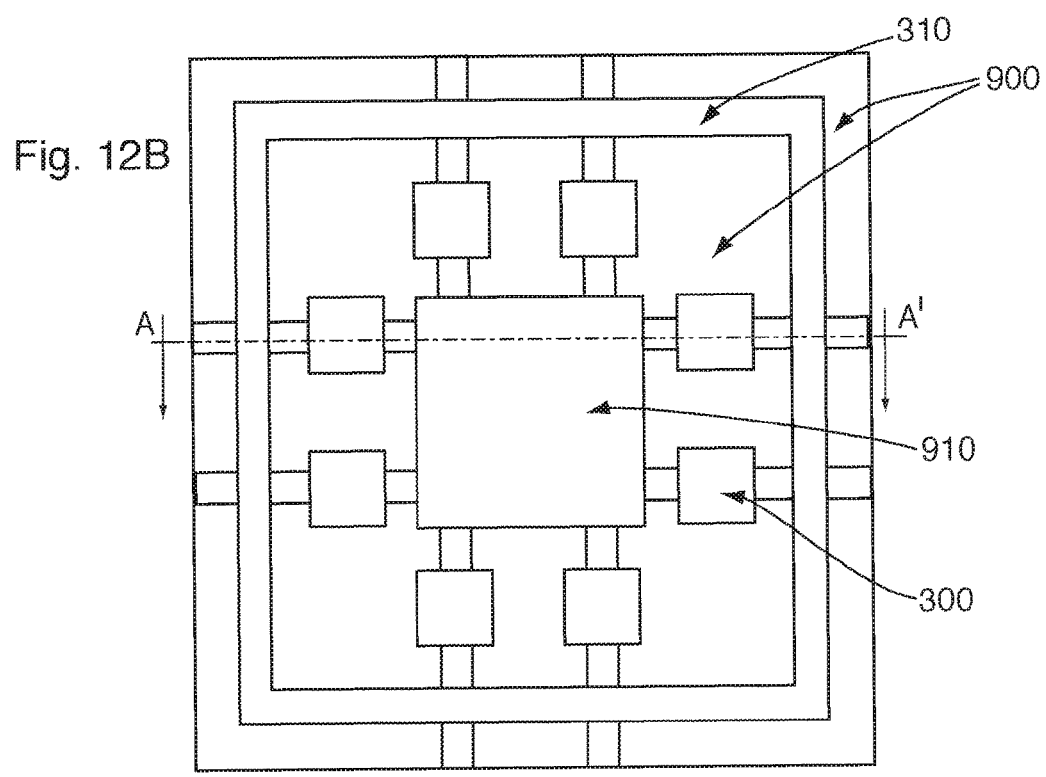

CAVITY PACKAGE WITH PRE-MOLDED SUBSTRATE

RELATED APPLICATIONS

This application claims priority from U.S. patent application 61/870,352, filed Aug. 27, 2013. Priority is claimed to this earlier filed application and the contents of this earlier-filed application are incorporated herein, in their entirety, by reference.

FIELD OF INVENTION

The present invention relates generally to integrated circuits, and more particularly to a cavity package with a pre-molded substrate.

BACKGROUND

Flat no-leads packages such as QFN (quad-flat no-leads) and DFN (dual-flat no-leads) are used to physically and electrically connect integrated circuits to printed circuit boards. Two types of flat no-leads packages are common: cavity (i.e. with a cavity designed into the package containing air or nitrogen), and plastic-molded (i.e. with minimal air in the package).

Cavity packages are small and lightweight, with good thermal and electrical performance that makes them suitable for portable communication/consumer products. Applications include cellular phones, PDAs, wireless transmitters, RF front end, HD devices, microcontrollers, pre-amplifiers, servers, smart power suppliers, switches, DSPs, ASICs, MEMS (Micro Mechanical and Electrical System) and wrist watches.

Cavity packages are usually made up of three parts; a copper leadframe, plastic-molded body (open, and not sealed), and a cap or lid attached to the plastic portion of the leadframe. An integrated circuit is mounted to a die attach pad within the cavity, with wire leads connecting the IC to the leadframe. The leadframe terminates in contacts on the bottom of the package for providing electrical interconnection with a printed circuit board.

In conventional cavity packages, a two-metal layer organic laminate is used with a via connecting the top metal layer to the bottom metal layer in order to fabricate an isolated ring.

SUMMARY

Unlike conventional cavity packages, which use a two-metal layer organic laminate substrate and a via to connect the top metal layer to the bottom metal layer, according to an aspect of the invention an isolated ring is fabricated onto a one-metal-layer substrate. All of the necessary metal features such as the ring, the I/O contact pads and the die attach paddle are created and connected together by temporary tie bars, and are then electrically isolated by etching away the temporary tie bars after the leadframe is pre-molded. An electrical ground path is created for the die attach pad and the metal cap through the ring and substrate to a further metal ring surrounding the I/O contact pads on the bottom side of the leadframe. This allows a metal cap to be connected to the pre-molded leadframe via solder reflow, in order to protect the I/O contact pads, wires and the integrated circuit.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIGS. 5A-5C are top, bottom and cross-sectional views, respectively, of the substrate of FIGS. 4A-4C after removal of the selective plating resist, according to a fourth step of the process set forth in FIG. 1.

FIGS. 6A-6C are top, bottom and cross-sectional views, respectively, of the substrate of FIGS. 5A-5C after application of a selective etching resist, according to a fifth step of the process set forth in FIG. 1.

FIGS. 10A-10C are top, bottom and cross-sectional views, respectively, of the substrate of FIGS. 9A-9C after etching away of non-plated temporary tie bars on the bottom surface of the substrate, according to a ninth step of the process set forth in FIG. 1.

FIGS. 12A-12C are top, bottom and cross-sectional views, respectively, of the cavity package following attachment of a cap to protect the wire-bonded device, according to a last step of the process set forth in FIG. 1.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

With reference to FIGS. 1A-1C through 12D-12E, construction of a cavity package with a pre-molded substrate is shown, according to an exemplary embodiment. It should be noted that whereas FIGS. 1A-1C through 12D-12E, show construction of a single cavity package with a pre-molded substrate, in practice a matrix comprising a plurality of cavity packages is fabricated so that multiple packages are fabricated simultaneously and then singulated into individual packages, as discussed in greater detail below.

Figure 1:
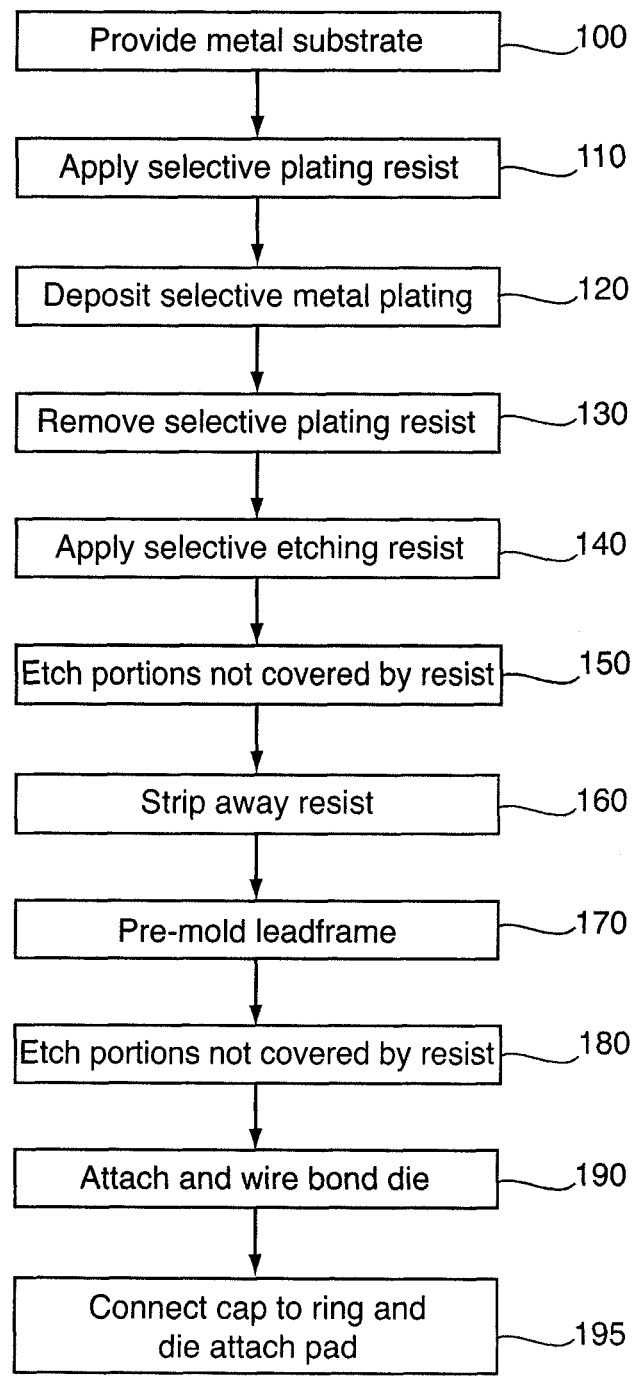
FIG. 1 is a flowchart showing steps in a process for constructing a cavity package with a pre-molded substrate, according to an exemplary embodiment.
Figure 2A:
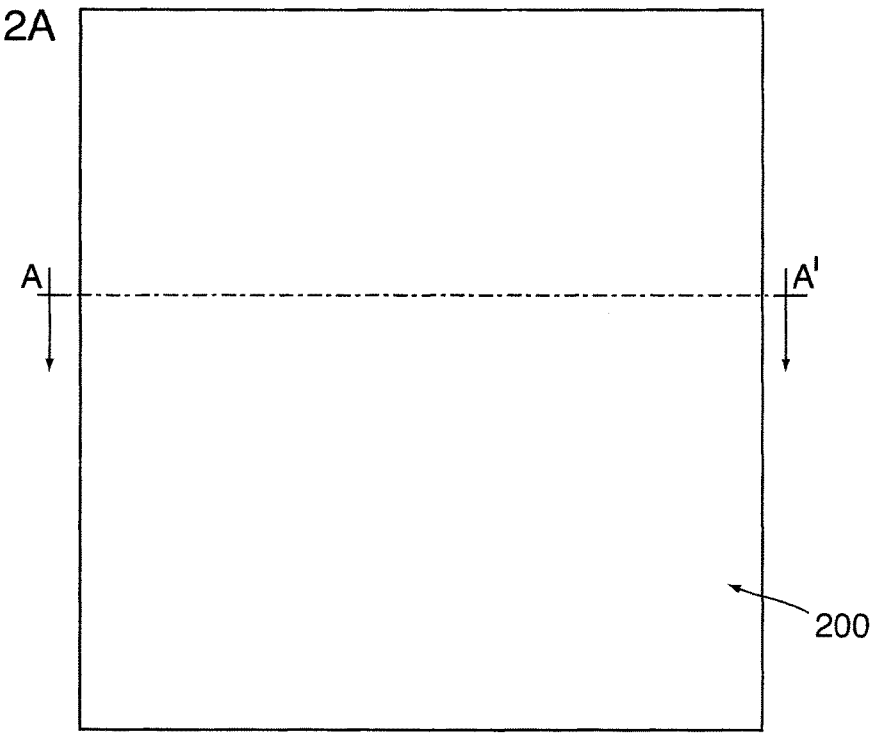
FIGS. 2A-2C are top, bottom and cross-sectional views, respectively, of a raw copper substrate at a first step of the process set forth in FIG. 1.
Figure 2B:
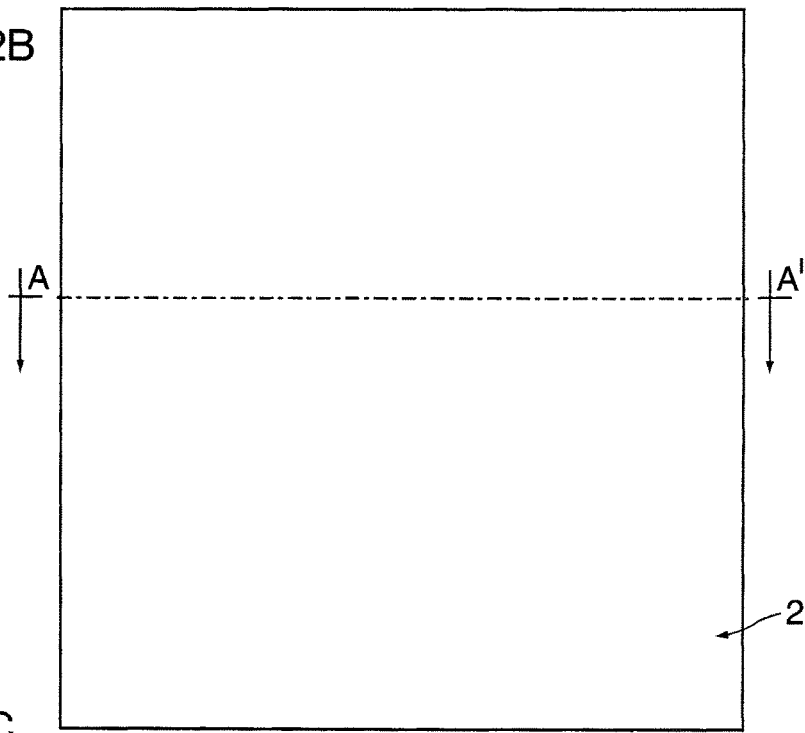
Figure 2C:
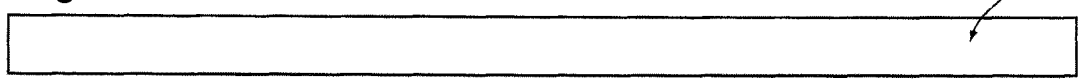

Construction of the cavity package begins at step 100 (FIG. 1) with fabrication of a metal (e.g. Cu) substrate 200, as shown in FIGS. 2A-2C, where FIG. 2C is a cross-section through the line A-A' in FIGS. 2A and 2B.

Figure 3A:
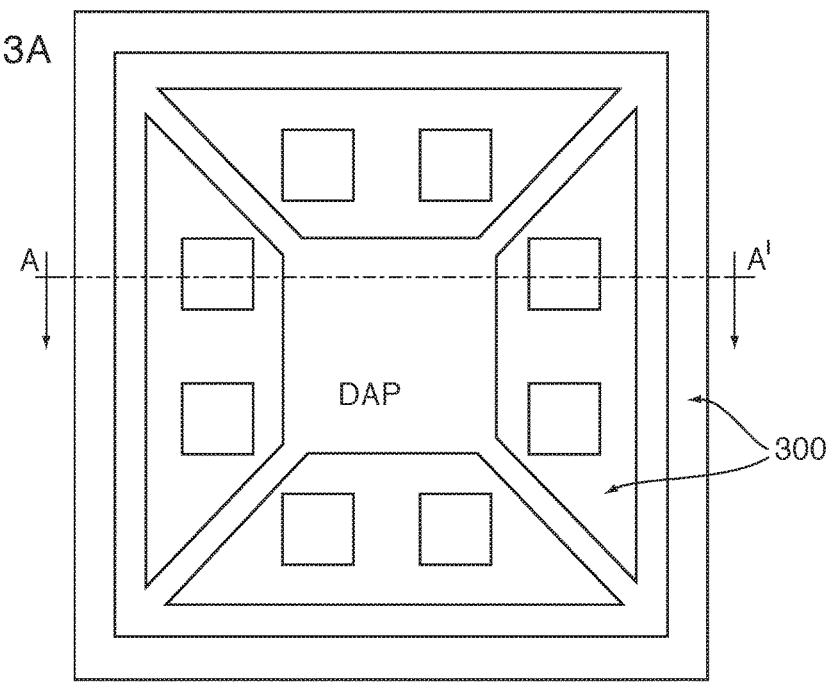
FIGS. 3A-3C are top, bottom and cross-sectional views, respectively, of the substrate of FIGS. 2A-2C after application of a selective plating resist, according to a second step of the process set forth in FIG. 1.
Figure 3B:
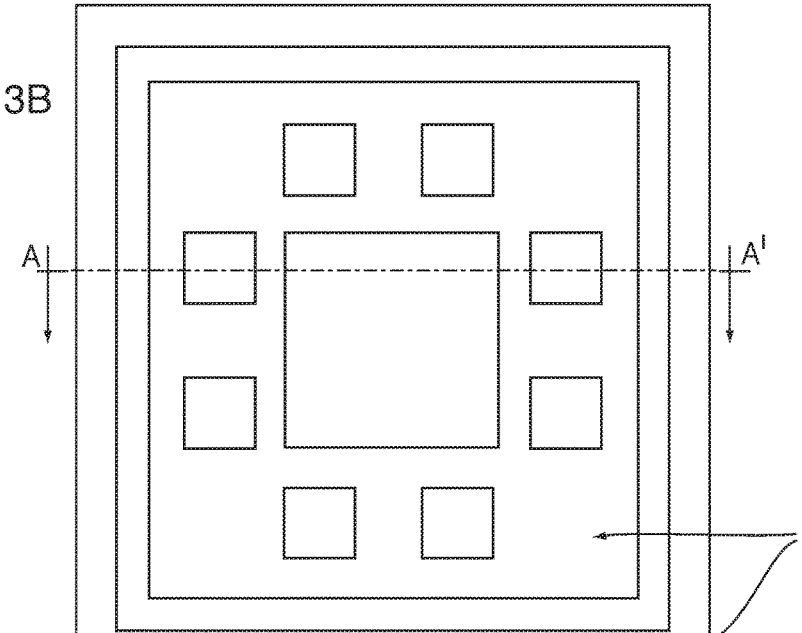
Figure 3C:

At step 110, a selective plating resist 300 (e.g. Photo-Imagable type) is applied to the substrate 200, as shown in FIGS. 3A-3C, to prepare the substrate for selective metal plating. Exposed portions are shown for a top and bottom surface rings 310, top surface tie bars 320 and top and bottom input/output (I/O) contact pads 330, deposited in step 130 (discussed below).

Figure 4A:
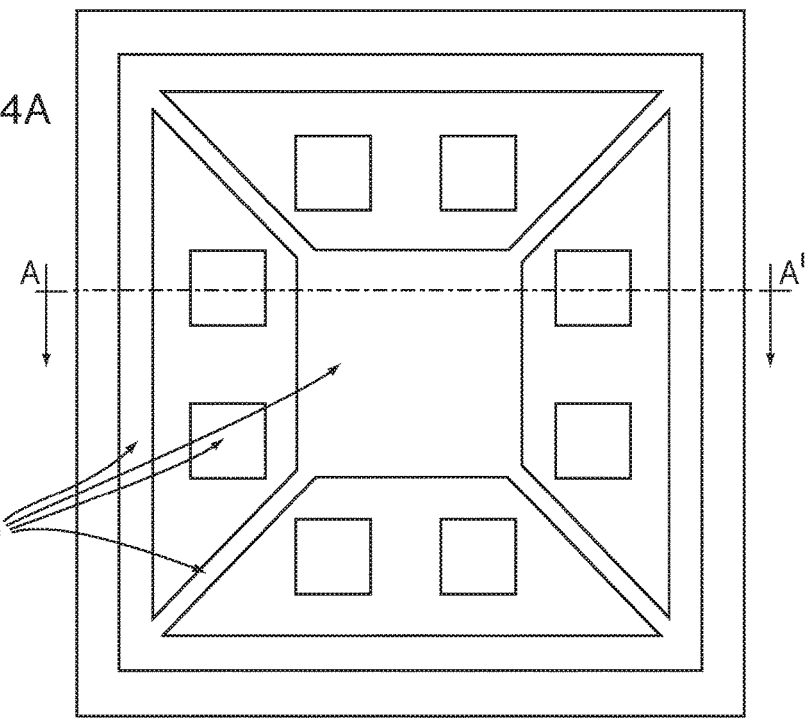
FIGS. 4A-4C are top, bottom and cross-sectional views, respectively, of the substrate of FIGS. 3A-3C after selective metal plating using the selective plating resist, according to a third step of the process set forth in FIG. 1.
Figure 4B:
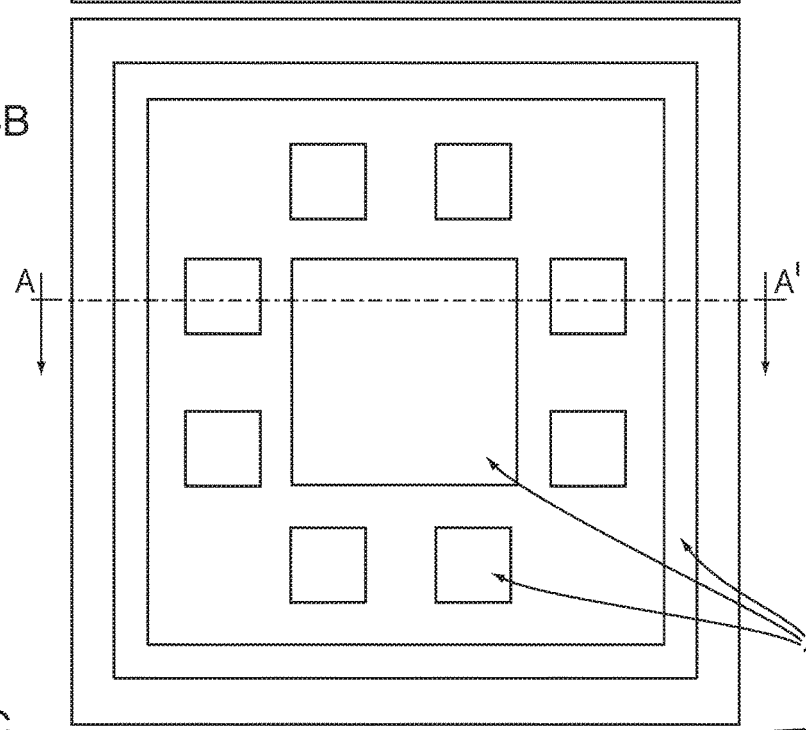
Figure 4C:

At step 120, selective metal plating 400 (e.g. Ag, Ni/Au, Ni/Pd/Au, etc.) is deposited using the selective patterned plating resist 300, as shown in FIGS. 4A-4C.

At step 130, the selective metal plating resist 300 is removed, as shown in FIGS. 5A-5C, revealing the top and bottom surface rings 310, top surface tie bars 320, die attach pad 910, and top and bottom input/output (I/O) contact pads 330.

At step 140, a selective etching resist 600 (e.g. Photo-Imageable type) is applied to the substrate 200, as shown in FIGS. 6A-6C.

Figure 7A:
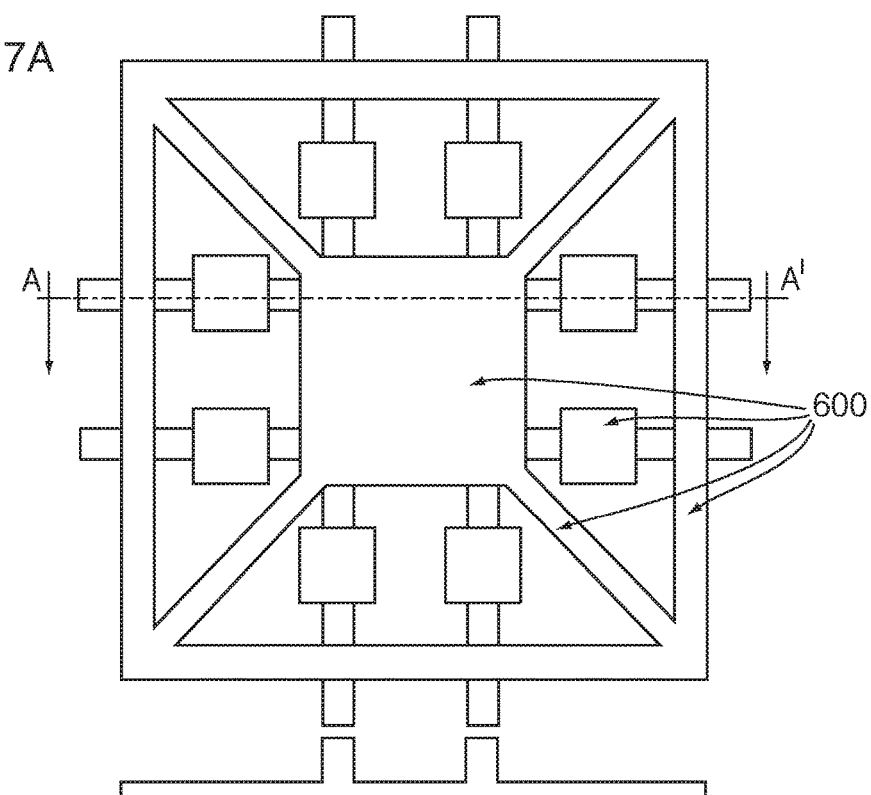
FIGS. 7A-7C are top, bottom and cross-sectional views, respectively, after etching away portions of the copper substrate of FIGS. 6A-6C not covered by the selective etching resist, according to a sixth step of the process set forth in FIG. 1.
Figure 7B:
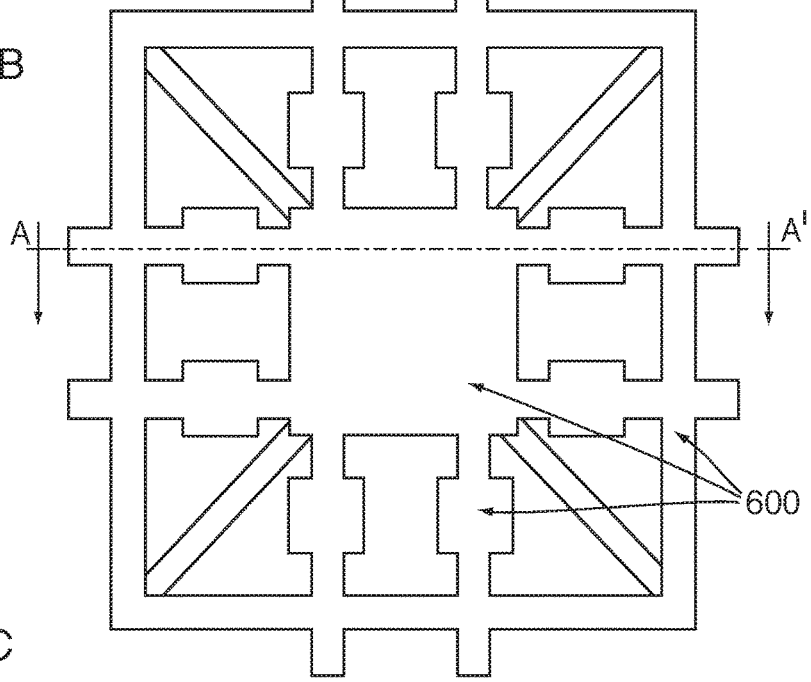
Figure 7C:
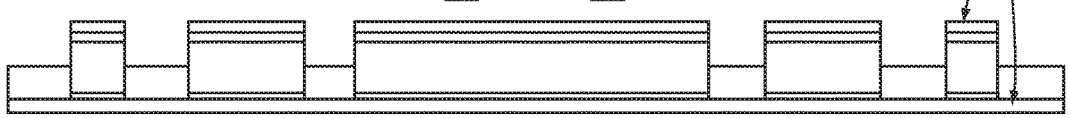

At step 150, the portions of substrate 200 not covered by the selective etching resist 300 are etched away from the top and bottom surfaces at the same etching rate, as shown in FIGS. 7A-7C.

Figure 8A:
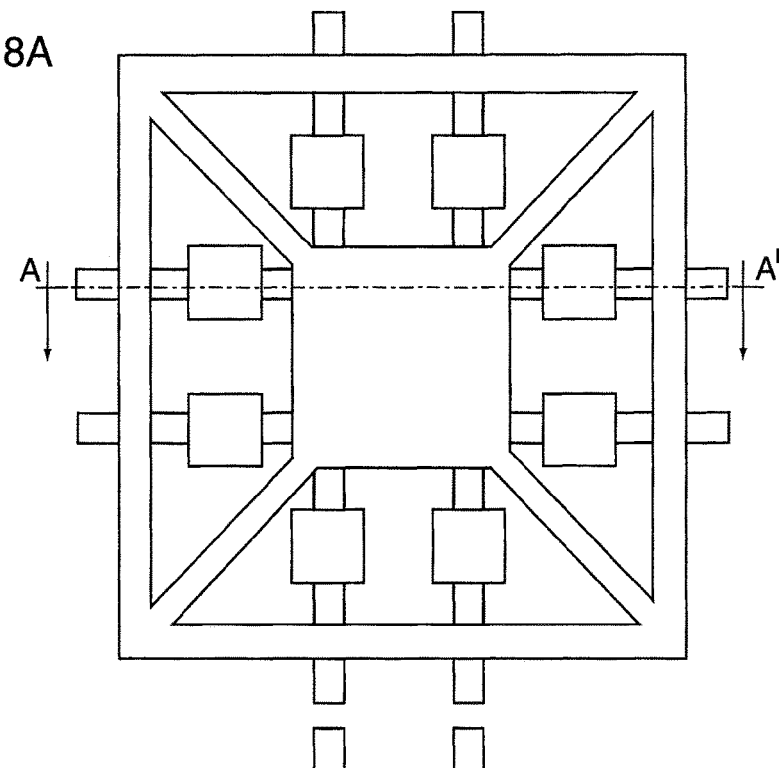
FIGS. 8A-8C are top, bottom and cross-sectional views, respectively, of the substrate of FIGS. 7A-7C after removal of the selective etching resist, according to a seventh step of the process set forth in FIG. 1.
Figure 8B:
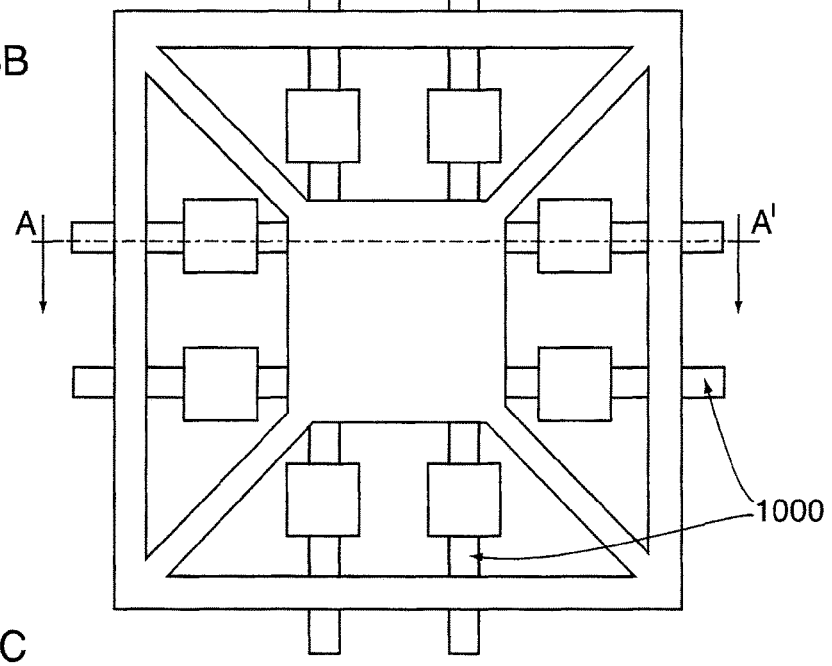
Figure 8C:
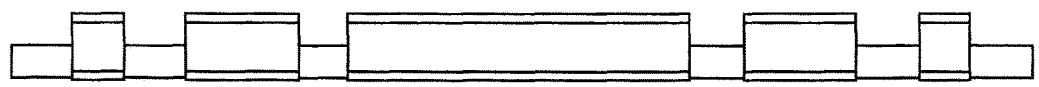

At step 160, the selective etching resist 600 is stripped away, as shown in FIGS. 8A-8C, revealing temporary tie bars 1000 on the bottom surface.

Figure 9A:
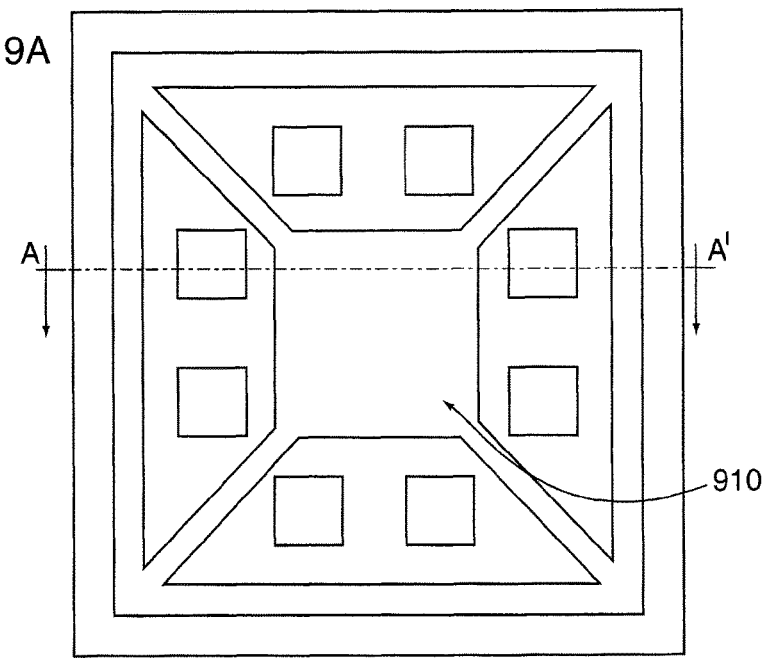
FIGS. 9A-9C are top, bottom and cross-sectional views, respectively, of the substrate of FIGS. 8A-8C after pre-molding of a leadframe thereto, according to an eight step of the process set forth in FIG. 1.
Figure 9B:
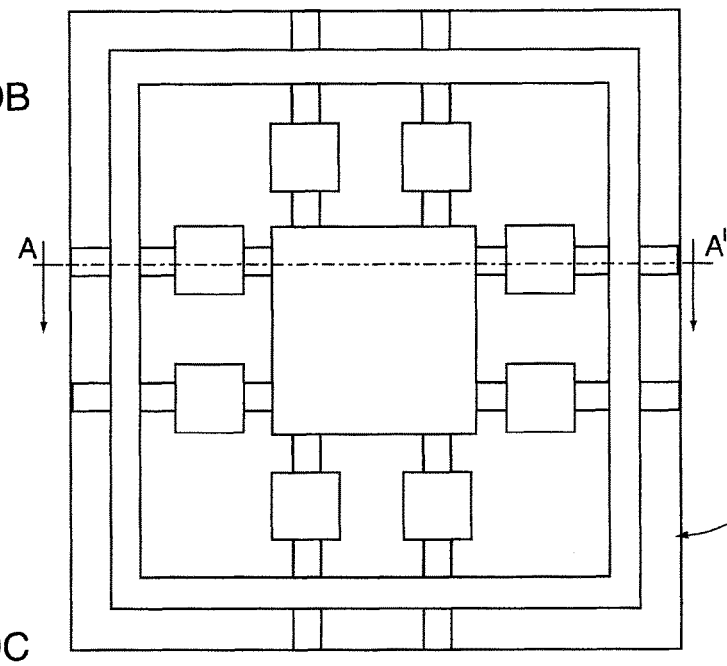
Figure 9C:
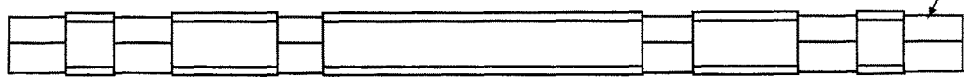

At step 170, a leadframe 900 is pre-molded to the substrate 200, surrounding die attach pad 910, as shown in FIGS. 9A-9C. It will be noted that the leadframe molding is deposited only on portions where there are no metallic features (e.g. contact pads 330, die attach pad 910, etc.), and to a thickness is limited by the temporary tie bars 1000 on the bottom surface.

At step 180, the non-plated temporary tie bars 1000 are etched away from the bottom surface of the substrate using the pre-plated metal as the etching resist remaining after step 120 as a mask, as shown in FIGS. 10A-10C.

Figure 11A:
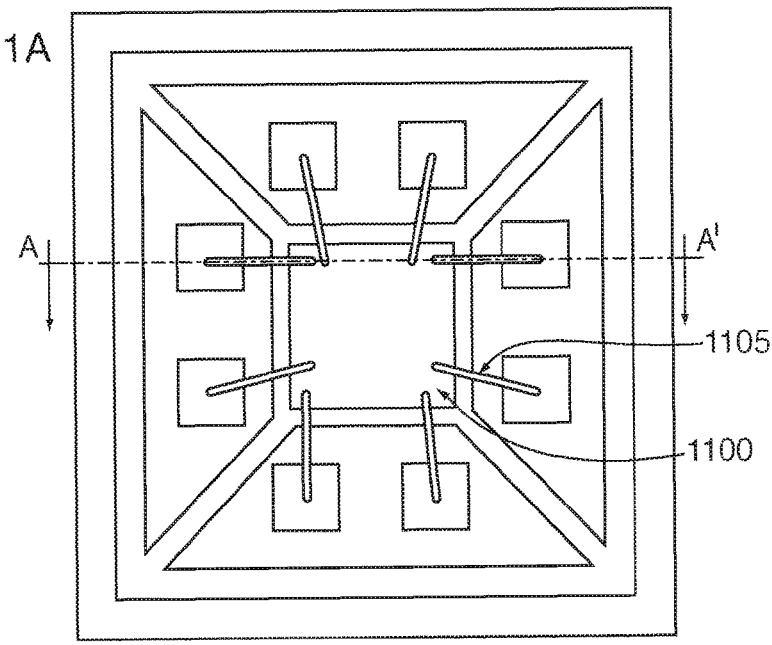
FIGS. 11A-11C are top, bottom and cross-sectional views, respectively, of the substrate of FIGS. 10A-10C following attachment and wire bonding of an integrated circuit, according to a tenth step of the process set forth in FIG. 1.
Figure 11B:
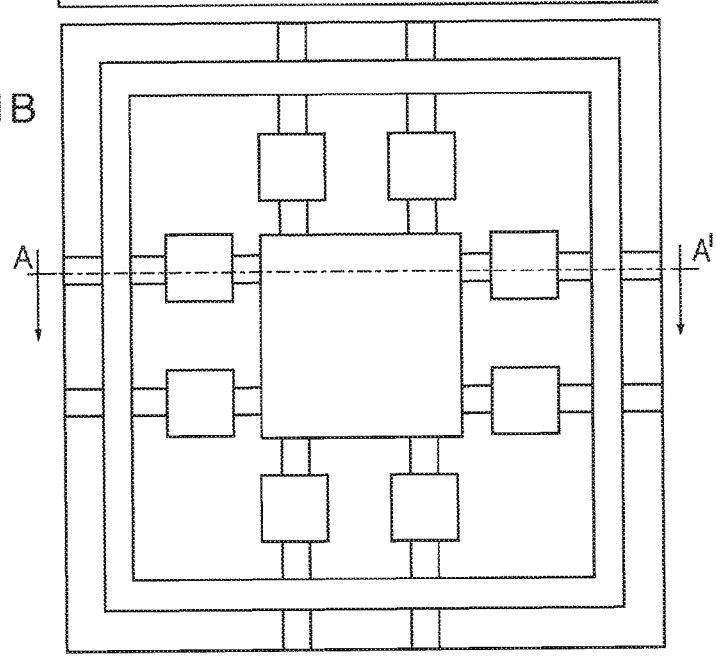
Figure 11C:
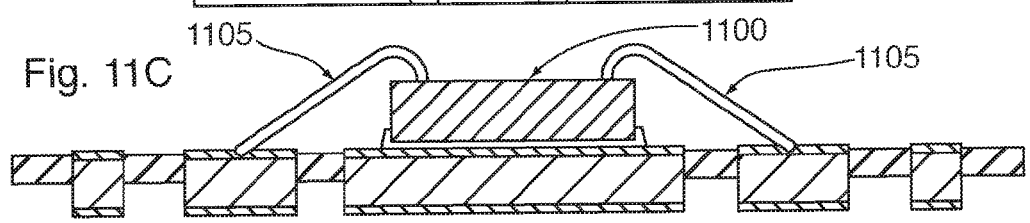

At step 190, integrated circuit 1100 is attached to the pre-molded substrate and wire bonded to input/output (I/O) contact pads via wires 1105, as shown in FIGS. 11A-11C.

Figure 12C:
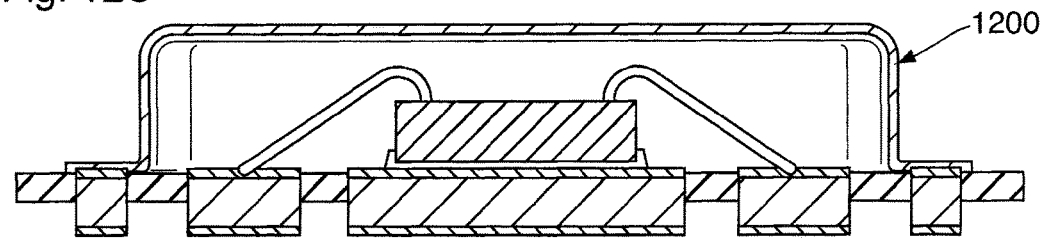
Figure 12D:
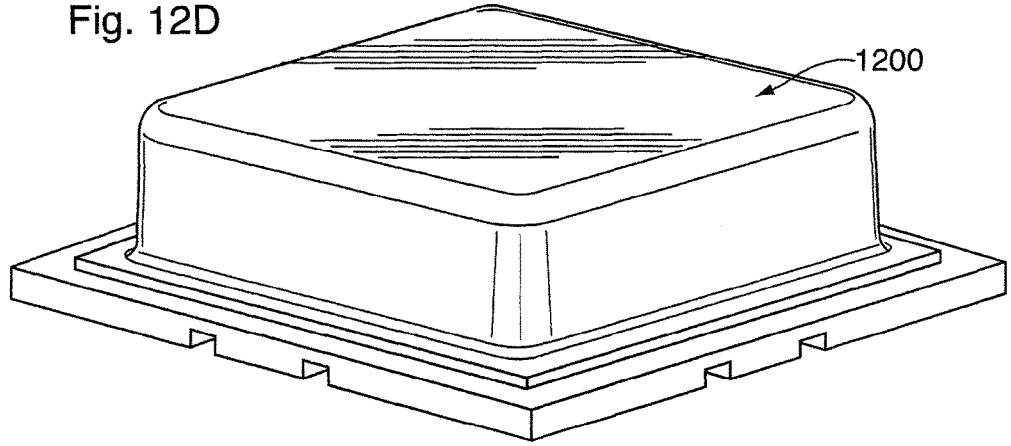
FIGS. 12D and 12E are top and bottom perspective views, respectively, of the cavity package shown in FIGS. 12A-12C.

At step 195, a cap 1200 is attached and electrically connected to the ring 310 and die attach pad 910 of the substrate 200 (e.g. by means of conductive epoxy or solder reflow) to protect the wire bonded device and permit electrical grounding, as shown in FIGS. 12A-12C.

As discussed above, in practice a matrix of cavity packages is fabricated. Therefore, after step 195, the matrix is singulated (e.g. using saw singulation) to create individual packages, such as the single package shown in FIGS. 12D and 12E.

Figure 12E:
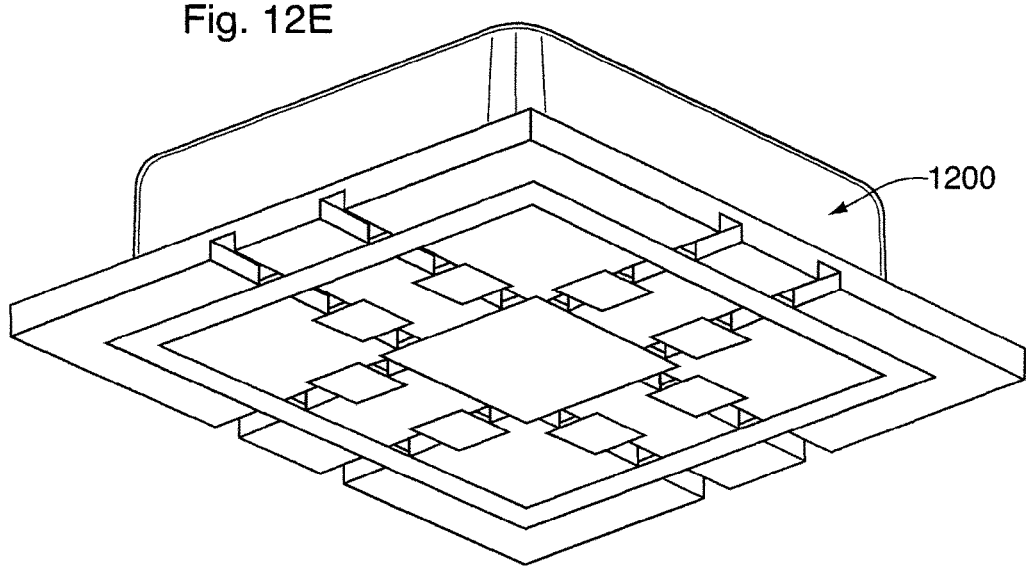

As shown in FIG. 12E, an electrical ground path is created for the die attach pad 910 and the metal cap 1200 through the top ring and copper substrate to the bottom metal ring, in order to protect the I/O contact pads 320, wires and the integrated circuit.

While the forgoing exemplary embodiment is illustrative of the principles of the present invention, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A method of manufacturing a cavity package comprising:
   i) applying a selective plating resist to a metallic substrate;
   ii) selective deposition of metal plating using the selective plating resist;
   iii) removing the selective metal plating resist to form a plurality of features, including top and bottom rings, a die attach pad for affixing an integrated circuit, a plurality of contact pads, and at least one tie bar for connecting the die attach pad to the top ring;
   iv) applying a selective etching resist to the substrate;
   v) selectively etching portions of the substrate not covered by the selective etching resist to form temporary tie bars between the bottom ring, die attach pad and contact pads;
   vi) stripping away the selective etching resist;
   vii) pre-molding a leadframe to the substrate so as to surround the plurality of features;
   viii) etching the tie temporary bars away from the bottom surface of the substrate using the pre-plated metal remaining after removal of the selective metal plating resist as a mask;
   ix) attaching a semiconductor device to the die attach pad;
   x) wire bonding the semiconductor device to the input/output contact pads on the top surface;
   xi) attaching a metal cap to the leadframe via the top ring for providing a electrical ground path for the die attach pad and the cap through the top ring and substrate to the bottom ring.

2. The method of claim 1, wherein the cap is attached to the ring portion by means of epoxy.

3. The method of claim 1, wherein the cap is attached to the ring portion by means of solder reflow.

4. The method of claim 1, wherein the plating resist is a photo-imagable resist.

5. The method of claim 1, wherein the etching resist is a photo-imagable resist.

6. The method of claim 1, wherein the metal plating is selected from the group comprising Ag, Ni/Au and Ni/Pd/Au.

* * * * *